United States Patent
Kinoshita et al.

(10) Patent No.: US 10,164,011 B2
(45) Date of Patent: Dec. 25, 2018

(54) NITRIDE SEMICONDUCTOR DEVICE

(71) Applicant: PANASONIC CORPORATION, Osaka (JP)

(72) Inventors: Yusuke Kinoshita, Kyoto (JP); Hidekazu Umeda, Osaka (JP); Satoshi Tamura, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 3 days.

(21) Appl. No.: 15/695,834

(22) Filed: Sep. 5, 2017

(65) Prior Publication Data
US 2018/0012960 A1    Jan. 11, 2018

Related U.S. Application Data

(63) Continuation of application No. PCT/JP2016/001121, filed on Mar. 2, 2016.

(30) Foreign Application Priority Data

Apr. 2, 2015 (JP) .................... 2015-076094

(51) Int. Cl.
*H01L 29/06* (2006.01)
*H01L 29/808* (2006.01)
(Continued)

(52) U.S. Cl.
CPC ...... *H01L 29/0661* (2013.01); *H01L 29/0619* (2013.01); *H01L 29/2003* (2013.01);
(Continued)

(58) Field of Classification Search
CPC . H01L 29/0661; H01L 29/205; H01L 29/402; H01L 29/2003; H01L 29/7787
See application file for complete search history.

(56) References Cited

U.S. PATENT DOCUMENTS 7,326,971 B2 * 2/2008 Harris ................ H01L 29/7783
257/194
8,603,880 B2 * 12/2013 Yamada .............. H01L 29/2003
257/192
(Continued)

FOREIGN PATENT DOCUMENTS

JP    2008-211172 A    9/2008
JP    2015-026629 A    2/2015
(Continued)

OTHER PUBLICATIONS

International Search Report and Written Opinion issued in International Patent Application No. PCT/JP2016/001121, dated May 24, 2016; with partial English translation.

*Primary Examiner* — William Coleman
(74) *Attorney, Agent, or Firm* — McDermott Will & Emery LLP

(57) ABSTRACT

A nitride semiconductor device includes a substrate; a nitride semiconductor layered structure disposed on the substrate and having a channel region; a first electrode and a second electrode both disposed on the nitride semiconductor layered structure; a first p-type nitride semiconductor layer disposed between the first electrode and the second electrode; and a first gate electrode disposed on the first p-type nitride semiconductor layer. The nitride semiconductor layered structure includes a first recess. The first p-type nitride semiconductor layer is at least partially disposed inside the first recess, and is separated from a side surface of the first recess.

17 Claims, 12 Drawing Sheets

(51) Int. Cl.
  *H01L 29/20*  (2006.01)
  *H01L 29/205*  (2006.01)
  *H01L 29/40*  (2006.01)
  *H01L 29/778*  (2006.01)
  *H01L 29/423*  (2006.01)
  *H01L 29/10*  (2006.01)

(52) U.S. Cl.
  CPC .......... *H01L 29/205* (2013.01); *H01L 29/402* (2013.01); *H01L 29/7786* (2013.01); *H01L 29/7787* (2013.01); *H01L 29/808* (2013.01); *H01L 29/1066* (2013.01); *H01L 29/42316* (2013.01)

(56) References Cited

U.S. PATENT DOCUMENTS

| | | | |
|---|---|---|---|
| 8,895,992 B2* | 11/2014 | Liu | H01L 29/66431 257/192 |
| 9,024,357 B2* | 5/2015 | Puglisi | H01L 29/66462 257/194 |
| 9,159,784 B2* | 10/2015 | Romano | H01L 29/66212 |
| 9,293,574 B2* | 3/2016 | Okita | H01L 29/66431 |
| 9,530,858 B2* | 12/2016 | Terano | H01L 29/66318 |
| 9,882,039 B2* | 1/2018 | Khan | H01L 29/7783 |
| 2008/0179694 A1 | 7/2008 | Nakazawa et al. | |
| 2010/0044752 A1* | 2/2010 | Marui | H01L 29/66462 257/192 |
| 2011/0024797 A1 | 2/2011 | Nakazawa et al. | |
| 2013/0020584 A1 | 1/2013 | Oishi et al. | |
| 2014/0097468 A1 | 4/2014 | Okita et al. | |
| 2014/0225161 A1 | 8/2014 | Okita et al. | |
| 2015/0034962 A1 | 2/2015 | Cao et al. | |
| 2018/0040706 A1* | 2/2018 | Kaneko | H01L 29/1029 |

FOREIGN PATENT DOCUMENTS

| | | |
|---|---|---|
| WO | 2011/132285 A1 | 10/2011 |
| WO | 2013/008422 A1 | 1/2013 |

* cited by examiner

NITRIDE SEMICONDUCTOR DEVICE

CROSS REFERENCE TO RELATED APPLICATIONS

This is a continuation application of PCT International Application No. PCT/JP2016/001121 filed on Mar. 2, 2016, designating the United States of America, which is based on and claims priority of Japanese Patent Application No. 2015-076094 filed on Apr. 2, 2015. The entire disclosures of the above-identified applications, including the specifications, drawings and claims are incorporated herein by reference in their entirety.

BACKGROUND

1. Technical Field

The present disclosure relates to a nitride semiconductor device.

2. Description of the Related Art

Conventionally, a normally-off nitride semiconductor device including a p-type semiconductor layer that covers a gate recess has been proposed (for example, see Japanese Unexamined Patent Application Publication No. 2008-211172). With this configuration, in regions other than the gate recess (concave portion 110a in Japanese Unexamined Patent Application Publication No. 2008-211172), since a thick barrier layer (second nitride semiconductor layer 104 in Japanese Unexamined Patent Application Publication No. 2008-211172 can be made, the nitride semiconductor layer, which is sensitive to crystal defects, can be disposed far from the two-dimensional electron gas (2DEG) layer. As a result, it possible to inhibit the phenomenon known as current collapse, whereby drain current reduces when a high drain voltage is applied.

SUMMARY

However, in nitride semiconductor devices, since the 2DEG layer is active in regions other than the gate recess even when gate voltage is not being applied, parasitic capacitance exists between the gate electrode and the 2DEG layer and/or the p-type semiconductor layer and the 2DEG layer. These parasitic capacitances (also collectively referred to as gate capacitances) are problematic because they hinder high-speed driving of such devices. In the structure disclosed in Japanese Unexamined Patent Application Publication No. 2008-211172, among gate capacitances, in a plan view, the parasitic capacitance existing between the p-type semiconductor layer formed outside of the gate recess and the 2DEG layer is particularly high, which is problematic.

The present disclosure has an object to solve the above problem by providing a nitride semiconductor device capable of reducing gate capacitance and inhibiting current collapse.

In order to solve the above problem, according to one aspect of the present disclosure, a nitride semiconductor device includes: a substrate; a nitride semiconductor layered structure disposed on the substrate and having a channel region; a first electrode and a second electrode both disposed on the nitride semiconductor layered structure; a first p-type nitride semiconductor layer disposed between the first electrode and the second electrode; and a first gate electrode disposed on the first p-type nitride semiconductor layer. The nitride semiconductor layered structure includes a first recess. The first p-type nitride semiconductor layer is at least partially disposed inside the first recess, and is separated from a side surface of the first recess.

With the nitride semiconductor device according to the present disclosure, it is possible to reduce gate capacitance and inhibit current collapse.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
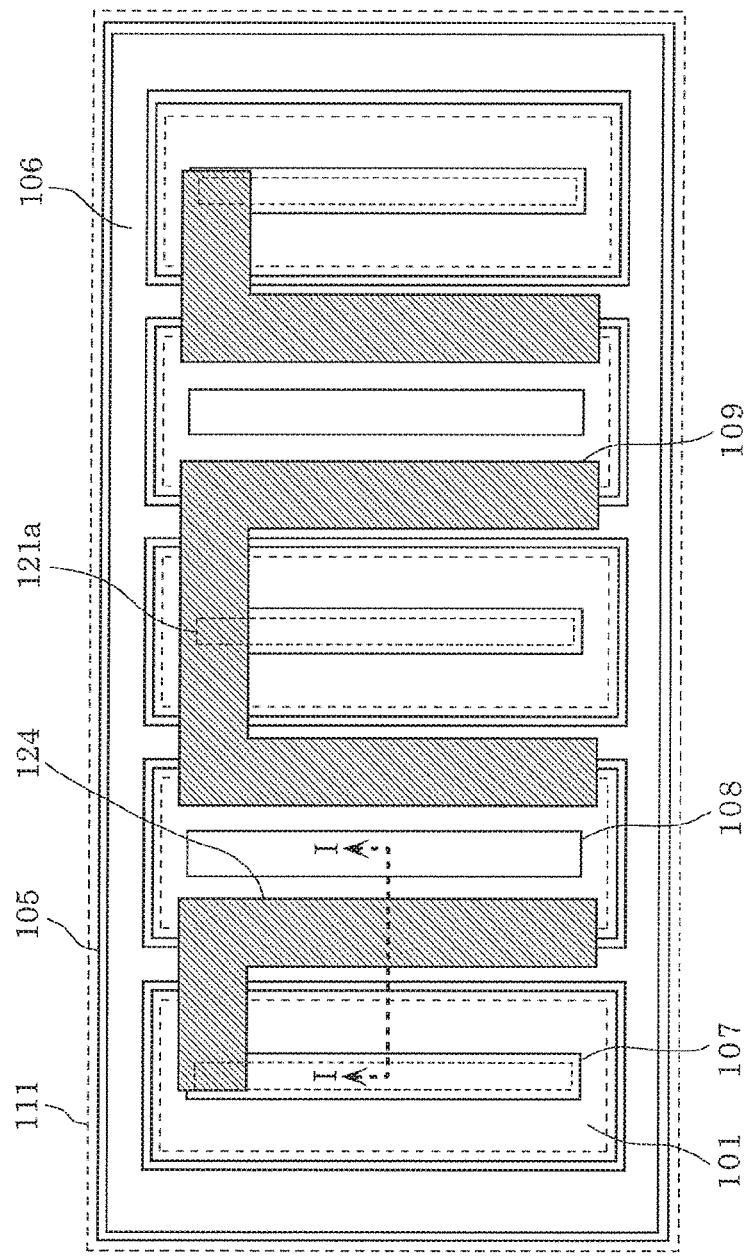
FIG. 1 is a plan view of the nitride semiconductor device according to Embodiment 1.

A nitride semiconductor device according to one aspect of the present disclosure includes: a substrate; a nitride semiconductor layered structure disposed on the substrate and having a channel region; a first electrode and a second electrode both disposed on the nitride semiconductor layered structure; a first p-type nitride semiconductor layer disposed between the first electrode and the second electrode; and a first gate electrode disposed on the first p-type nitride semiconductor layer. The nitride semiconductor layered structure includes a first recess. The first p-type nitride semiconductor layer is at least partially disposed inside the first recess, and is separated from a side surface of the first recess.

With this configuration, the surface area of the p-type nitride semiconductor layer that faces the 2DEG layer can be reduced, making it possible to reduce gate capacitance. Moreover, since an end of the depletion layer at which the electric field resulting from the drain voltage concentrates moves to an area of the second nitride semiconductor layer that is thick in film thickness, the electrons accelerated by a high electric field are less likely to be trapped by surface defects, which inhibits current collapse. Accordingly, it is possible to provide a nitride semiconductor device capable of reducing gate capacitance and inhibiting current collapse.

Moreover, the nitride semiconductor layered structure may include: a first nitride semiconductor layer; and a second nitride semiconductor layer disposed on the first nitride semiconductor layer and having a band gap that is greater than a band gap of the first nitride semiconductor layer. A bottom surface and the side surface of the first recess may be a surface of the second nitride semiconductor layer.

With this configuration, since the distance between the surface of nitride semiconductor layered structure and the 2DEG layer can be increased, it is possible to inhibit current collapse that stems from surface defects. Moreover, since an end of the depletion layer at which the electric field resulting from the drain voltage concentrates moves to an area of the second nitride semiconductor layer that is thick in film thickness, the electrons accelerated by a high electric field are less likely to be trapped by surface defects, which inhibits current collapse.

Moreover, the nitride semiconductor layered structure may include: a first nitride semiconductor layer; a second nitride semiconductor layer disposed on the first nitride semiconductor layer and having a band gap that is greater than a band gap of the first nitride semiconductor layer; and a third nitride semiconductor layer partially disposed on the second nitride semiconductor layer and having a band gap that is greater than the band gap of the first nitride semiconductor layer. A bottom surface of the first recess may be a surface of the second nitride semiconductor layer, and the side surface of the first recess may be a surface of the third nitride semiconductor layer.

With this configuration, since the distance between the surface of nitride semiconductor layered structure and the 2DEG layer is great, it is possible to inhibit current collapse that stems from surface defects. Moreover, since the distance between p-type nitride semiconductor layer the 2DEG layer can be increased, the parasitic capacitance between p-type nitride semiconductor layer and the 2DEG layer can be reduced.

Moreover, the nitride semiconductor layered structure may include: a first nitride semiconductor layer; a second nitride semiconductor layer partially disposed on the first nitride semiconductor layer and having a band gap that is greater than a band gap of the first nitride semiconductor layer; and a third nitride semiconductor layer disposed on the first nitride semiconductor layer and the second nitride semiconductor layer and having a band gap that is greater than the band gap of the first nitride semiconductor layer. A bottom surface and the side surface of the first recess may be a surface of the third nitride semiconductor layer.

With this configuration, when a threshold voltage or higher voltage is applied to the gate electrode, it is possible to form a 2DEG layer functioning as a channel region in the first nitride semiconductor layer, in the vicinity of the interface between the first nitride semiconductor layer and the third nitride semiconductor layer.

Moreover, the nitride semiconductor layered structure may include a second recess penetrating through the second nitride semiconductor layer. The second recess may be disposed below the first recess. A bottom surface and a side surface of the second recess may be a surface of the second nitride semiconductor layer.

With this configuration, directly below the second recess, there is an energy difference at the interface between the second nitride semiconductor layer and the third nitride semiconductor layer, which makes it even more difficult for the carriers of the two-dimensional electron gas to be captured by surface traps on the third nitride semiconductor layer. This makes it possible to further reduce current collapse.

Moreover, the nitride semiconductor layered structure may include a second recess in the second nitride semiconductor layer. The second recess may be disposed below the first recess. A bottom surface of the second recess may be a surface of the first nitride semiconductor layer, and a side surface of the second recess may include a surface of the second nitride semiconductor layer.

With this configuration, it is possible to form a 2DEG layer functioning as a channel region in the first nitride semiconductor layer, in the vicinity of the interface between the first nitride semiconductor layer and the second nitride semiconductor layer.

Moreover, the nitride semiconductor layered structure may include: a first nitride semiconductor layer; a second nitride semiconductor layer disposed on the first nitride semiconductor layer and having a band gap that is greater than a band gap of the first nitride semiconductor layer; and a third nitride semiconductor layer disposed on the first nitride semiconductor layer and the second nitride semiconductor layer and having a band gap that is greater than the band gap of the first nitride semiconductor layer. The bottom surface of the first recess may be a surface of the third nitride semiconductor layer, and the side surface of the first recess may be a surface of the second nitride semiconductor layer and a surface of the third nitride semiconductor layer.

With this configuration, there is an energy difference at the interface between the second nitride semiconductor layer and the third nitride semiconductor layer, which makes it possible to reduce current collapse since it is difficult for the carriers of the two-dimensional electron gas to be captured by surface traps on the third nitride semiconductor layer.

Moreover, the nitride semiconductor device may further include a second p-type nitride semiconductor layer disposed between the first p-type nitride semiconductor layer and the second electrode; and a second gate electrode disposed on the second p-type nitride semiconductor layer. The nitride semiconductor layered structure may include a third recess. The second p-type nitride semiconductor layer may be disposed inside the third recess and be separated from a side surface of the third recess.

With this configuration, it is possible to realize a two-way switch by disposing the p-type nitride semiconductor layer and the gate electrode inside the recess.

Moreover, the nitride semiconductor layered structure may include a fourth recess. The first electrode may be at least partially disposed inside the fourth recess. A bottom surface and a side surface of the fourth recess may be a surface of the third nitride semiconductor layer.

With this configuration, compared to when the fourth recess is not formed, the distance between the 2DEG layer and the source electrode and the distance between the 2DEG layer and the drain electrode can be reduced, making it possible to reduce contact resistance.

Moreover, the third nitride semiconductor layer may include AlGaN and have a composition ratio different from a compositional ratio of the second nitride semiconductor layer.

With this configuration, the band gap of the third nitride semiconductor layer can be made to be smaller than the band gap of the second nitride semiconductor layer by adjusting the film thicknesses of the second nitride semiconductor layer and the third nitride semiconductor layer.

Moreover, the band gap of the second nitride semiconductor layer may be greater than the band gap of the third nitride semiconductor layer.

With this configuration, there is an energy difference at the interface between the second nitride semiconductor layer and the third nitride semiconductor layer, which makes it possible to reduce current collapse since it is difficult for the carriers of the two-dimensional electron gas to be captured by surface traps on the third nitride semiconductor layer.

Moreover, the first nitride semiconductor layer may include GaN, and the second nitride semiconductor layer may include AlGaN.

With this configuration, it is possible to form a 2DEG layer functioning as a channel region in the first nitride semiconductor layer, in the vicinity of the interface between the first nitride semiconductor layer and the second nitride semiconductor layer since the band gap energy of the second nitride semiconductor layer can be increased beyond the band gap energy of the first nitride semiconductor layer.

Moreover, the side surface of the first recess may be rounded.

With this configuration, electric field concentration in the 2DEG layer in the lower portion of the recess can be alleviated. This makes it possible to inhibit current collapse in the nitride semiconductor device.

Moreover, the first gate electrode may be in Schottky contact with the first p-type nitride semiconductor layer. A first parasitic capacitance between the first gate electrode and the first p-type nitride semiconductor layer may be greater than a second parasitic capacitance between the first p-type nitride semiconductor layer and the channel region.

With this configuration, since the proportion of the divided gate voltage applied to the second parasitic capacitance is increases, positive holes are injected from the p-type nitride semiconductor layer to the channel region whereby two-dimensional electron gas is induced, making it easy for the gate to turn on. As a result, since the gate can be turned on at a low voltage, gate driving loss, which is determined by the product of the gate current and the gate voltage, can be reduced.

Moreover, a hole concentration of the first p-type nitride semiconductor layer may decrease one of continuously and stepwise from a top surface toward a bottom surface of the first p-type nitride semiconductor layer, the top surface being adjacent the first gate electrode and the bottom surface being adjacent the nitride semiconductor layered structure.

With this configuration, the first parasitic capacitance can be increased and the second parasitic capacitance can be reduced.

Moreover, in a plan view, the first p-type nitride semiconductor layer may be disposed inside the first recess in entirety. The side surface of the first recess may include a first side surface closer to the first electrode than the second electrode and a second side surface closer to the second electrode than the first electrode. The first p-type nitride semiconductor layer may be separated from the first side surface and the second side surface.

With this configuration, current collapse can be inhibited and gate capacitance can be reduced.

Moreover, the side surface of the first recess may include a first side surface closer to the first electrode than the second electrode and a second side surface closer to the second electrode than the first electrode. The first p-type nitride semiconductor layer may cover the first side surface and be separated from the second side surface.

With this configuration, since the p-type nitride semiconductor layer is in contact with the first side surface, a recess is not formed between the gate and source—that is to say, between the p-type nitride semiconductor layer and the source electrode. Accordingly, since there is no region in which the film thickness of the second nitride semiconductor layer thins between the gate and source, the 2DEG carrier density between the gate and source can be increased. This makes it possible to increase transconductance since low resistance can be achieved between the gate and source.

Hereinafter, each embodiment will be described with reference to the drawings. The present disclosure is not limited to the following embodiments. The drawings are schematic or conceptual, and relationships between the thicknesses and widths of each part, as well as the aspect ratio of the parts are not necessarily congruent with the actual parts. The dimensions or ratios may be illustrated differently even for parts which are essentially the same. Like elements share like reference signs, and as such, detailed description thereof may be omitted as necessary. Among elements in the following embodiments, those not recited in any of the independent claims defining the broadest inventive concept are described as optional elements.

Various modifications of the following embodiments that may be conceived by those skilled in the art are intended to be included within the scope of the present disclosure as long as they do not depart from the essence of the present disclosure. Moreover, embodiments resulting from arbitrary combinations of elements of the following embodiments are intended to be included within the scope of the present disclosure as long as they do not depart from the essence of the present disclosure.

Embodiment 1

Figure 2:
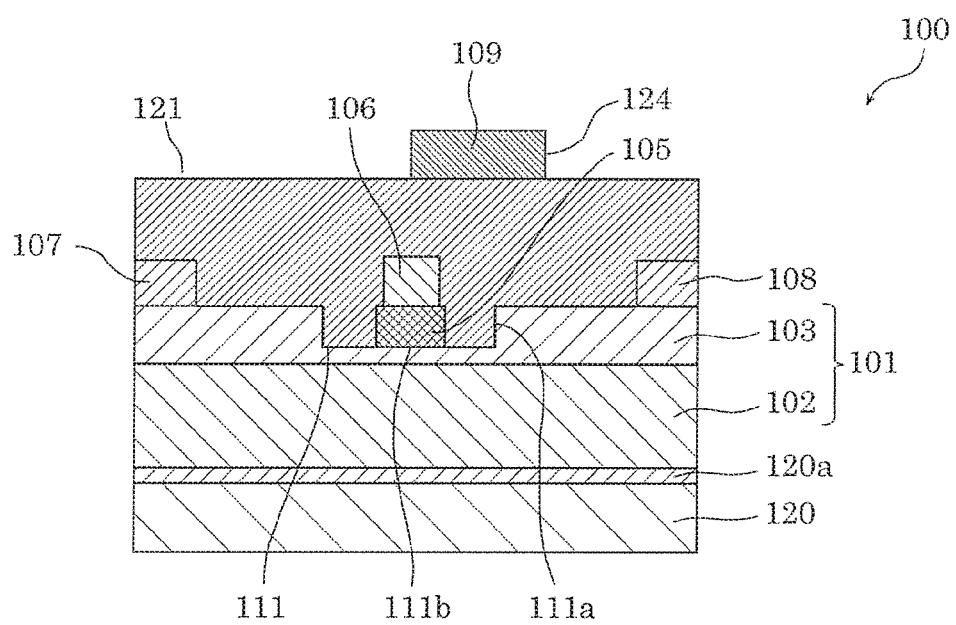
FIG. 2 is cross sectional view of the nitride semiconductor device according to Embodiment 1.

FIG. 1 is a plan view of the nitride semiconductor device according to Embodiment 1. FIG. 2 is cross sectional view of the nitride semiconductor device according to Embodiment 1. The cross section illustrated in FIG. 2 is taken at line I-I in FIG. 1.

As illustrated in FIG. 1, in a plan view, the nitride semiconductor device according to this embodiment is configured of nitride semiconductor devices 100 configured as illustrated in FIG. 2 arranged adjacent to one another.

As illustrated in FIG. 2, nitride semiconductor device 100 according to this embodiment includes substrate 120 and nitride semiconductor layered structure 101 that is disposed on substrate 120 and has a channel region. Buffer layer 120a, which is, for example, an AlN layer, is disposed between substrate 120 and nitride semiconductor layered structure 101.

Nitride semiconductor layered structure 101 includes first nitride semiconductor layer 102 and second nitride semiconductor layer 103 disposed on first nitride semiconductor layer 102. The band gap energy of second nitride semiconductor layer 103 is greater than the band gap energy of first nitride semiconductor layer 102. Therefore, a 2DEG layer functioning as the channel region is formed in first nitride semiconductor layer 102, in the vicinity of the interface between first nitride semiconductor layer 102 and second nitride semiconductor layer 103.

First nitride semiconductor layer 102 is, for example, an undoped GaN layer having a film thickness of approximately 3 μm. Second nitride semiconductor layer 103 is, for example, an undoped $Al_{0.2}Ga_{0.8}N$ layer having a film thickness of approximately 80 nm. "Undoped" means that no impurities are intentionally introduced.

First electrode 107 (hereinafter referred to as source electrode 107 unless otherwise noted) and second electrode 108 (hereinafter referred to as drain electrode 108 unless otherwise noted) are disposed on nitride semiconductor layered structure 101. P-type nitride semiconductor layer 105 (first p-type nitride semiconductor layer) is disposed between source electrode 107 and drain electrode 108. Gate electrode 106 is disposed on p-type nitride semiconductor layer 105.

P-type nitride semiconductor layer 105 is, for example, a p-type GaN layer having a film thickness of approximately 100 nm. P-type nitride semiconductor layer 105 preferably has a hole concentration that yields a normally-off device whose 2DEG layer carrier density is sufficiently low in the lower region of p-type nitride semiconductor layer 105. For example, the concentration of the p-type dopant, which is Mg, is approximately at least $2\times10^{19}/cm^3$ and at most $5\times10^{19}/cm^3$.

Nitride semiconductor layered structure 101 includes recess 111 (first recess) defined by recess side surface 111a and recess bottom surface 111b. P-type nitride semiconductor layer 105 is disposed in recess 111 and is separated from recess side surface 111a. In other words, p-type nitride semiconductor layer 105 is not in contact with recess side surface 111a. With this configuration, the surface area of p-type nitride semiconductor layer 105 that faces the 2DEG layer can be reduced, making it possible to reduce the gate capacitance.

In a state in which gate voltage is not being applied to gate electrode 106, the 2DEG layer is not formed below recess 111. Therefore, increasing the distance between p-type nitride semiconductor layer 105 and recess side surface 111a allows for the distance between p-type nitride semiconductor layer 105 and the 2DEG layer to be increased, which makes it possible to reduce the parasitic capacitance between p-type nitride semiconductor layer 105 and the 2DEG layer.

Recess 111 has a depth of approximately 60 nm. In other words, the film thickness of second nitride semiconductor layer 103 in the region where recess 111 is formed is approximately 20 nm. Recess side surface 111a and recess bottom surface 111b are a surface of second nitride semiconductor layer 103.

Moreover, since second nitride semiconductor layer 103 can be formed to have a comparatively large film thickness in the region between recess 111 and drain electrode 108, and the distance between the surface of nitride semiconductor layered structure 101 and the 2DEG layer can be increased, current collapse stemming from surface defects can be inhibited.

Moreover, when the drain voltage is increased in a state in which voltage is not being applied to gate electrode 106, the depletion layer extends to the drain electrode 108 side relative to recess side surface 111a. In other words, an end of the depletion layer at which the electric field resulting from the drain voltage concentrates moves to an area of second nitride semiconductor layer 103 that is comparatively thick in film thickness. Therefore, with the configuration of nitride semiconductor device 100 according to this embodiment, electrons accelerated by a high electric field are less likely to be trapped by surface defects, which inhibits current collapse.

Insulating film 121 including, for example, SiN, is disposed above nitride semiconductor layered structure 101. As illustrated in FIG. 1, field plate electrode 109 electrically connected to source electrode 107 is disposed on insulating film 121. Note that in FIG. 1, in order to facilitate clear understanding of nitride semiconductor device 100, illustration of insulating film 121 is omitted. Moreover, in order to make FIG. 1 more easier to understand, field plate electrode 109 is illustrated using hatching.

As illustrated in FIG. 1, source electrode 107 and field plate electrode 109 are electrically connected via insulating film opening 121a formed above a portion of source electrode 107. In a plan view, field plate electrode 109 is disposed between gate electrode 106 and drain electrode 108, and partially overlaps gate electrode 106. Field plate electrode 109 extends from only part of insulating film opening 121a in order to prevent an unwanted increase in parasitic capacitance between gate electrode 106 and source electrode 107. Note that the source electrode pad (not illustrated in the drawings) is connected to source electrode 107 via the remaining portion of insulating film opening 121a.

An electric field concentrates at end 124 of the drain electrode 108 side of field plate electrode 109 when voltage is applied to the drain. With nitride semiconductor device 100 according to this embodiment, as illustrated in FIG. 1, end 124 on the drain electrode 108 side of field plate electrode 109 is, in a plan view, disposed between recess 111 and drain electrode 108.

This makes it possible to avoid electric field concentration below recess 111 at second nitride semiconductor layer 103, which causes the distance between the 2DEG layer and nitride semiconductor layered structure 101 to be short. In other words, as a result of causing the electric field to concentrate in portions where the distance between the surface of nitride semiconductor layered structure 101 and the 2DEG layer is long, current collapse can be inhibited.

Note that gate electrode 106 may be single layer of a metal such as Ti, W, Ni, Pt, Pd, or Au, and may have a stacked structure of two or more of the listed metals. In these cases, gate electrode 106 is in ohmic contact with p-type nitride semiconductor layer 105. Moreover, gate electrode 106 may be a single layer of Al or WSi, for example, and may have a stacked structure of Al and Wsi. In these cases, gate electrode 106 is in Schottky contact with p-type nitride semiconductor layer 105.

When gate electrode 106 is in Schottky contact with p-type nitride semiconductor layer 105 and a positive gate voltage is applied, the depletion layer extends from gate electrode 106 to within p-type nitride semiconductor layer 105, and parasitic capacitance C1 exists between gate electrode 106 and p-type nitride semiconductor layer 105. The gate voltage is divided by parasitic capacitance C1 and parasitic capacitance C2 between p-type nitride semiconductor layer 105 and the two-dimensional electron gas of the channel region. When the divided voltage applied to parasitic capacitance C2 is a threshold voltage or higher, the gate turns on.

Accordingly, parasitic capacitance C1 is preferably greater than parasitic capacitance C2. With such a configuration, since the proportion C1/(C1+C2) of the divided gate voltage applied to parasitic capacitance C2 increases, positive holes are injected from p-type nitride semiconductor layer 105 to the channel region whereby two-dimensional electron gas is induced, making it easy for the gate to turn on. As a result, since the gate can be turned on at a low voltage, gate driving loss, which is determined by the product of the gate current and the gate voltage, can be reduced.

Note that parasitic capacitance C1 is further preferably at least 9 times greater than parasitic capacitance C2. In this case, at least 90% of the gate voltage is applied to parasitic capacitance C2, further making turning on the gate even easier.

The size of parasitic capacitance C1 is determined by the work function of the material included in gate electrode 106 and the hole concentration of p-type nitride semiconductor layer 105. In particular, the higher the hole concentration of p-type nitride semiconductor layer 105 is, the harder it is for the depletion layer to spread from gate electrode 106 to inside p-type nitride semiconductor layer 105. Therefore, in order to maintain the normally-off characteristic and increase parasitic capacitance C1, the hole concentration of p-type nitride semiconductor layer 105 preferably decreases continuously or stepwise in a direction from the gate electrode 106 side top surface toward the nitride semiconductor layered structure 101 side bottom surface.

Moreover, source electrode 107 and drain electrode 108 may be a single layer of, for example, Ti, Al, Mo, or Hf, and may have a stacked structure of two or more of the listed metals. The width of gate electrode 106 may be narrower than the width of p-type nitride semiconductor layer 105, and may be the same as the width of p-type nitride semiconductor layer 105.

Embodiment 2

Hereinafter, Embodiment 2 will be described with focus on the points of difference from Embodiment 1.

Nitride semiconductor device 200 according to this embodiment differs from nitride semiconductor device 100 according to Embodiment 1 in that the nitride semiconductor layered structure is configured of three layers.

Figure 3:
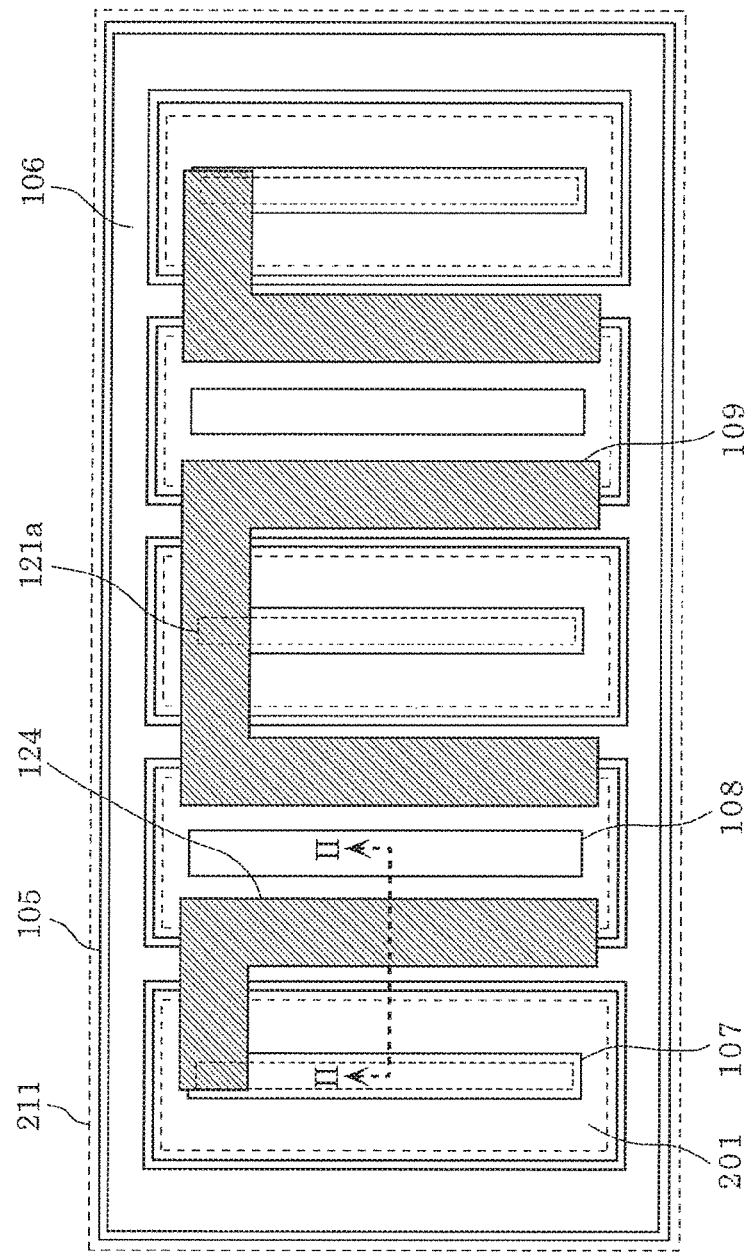
FIG. 3 is a plan view of the nitride semiconductor device according to Embodiment 2.
Figure 4:
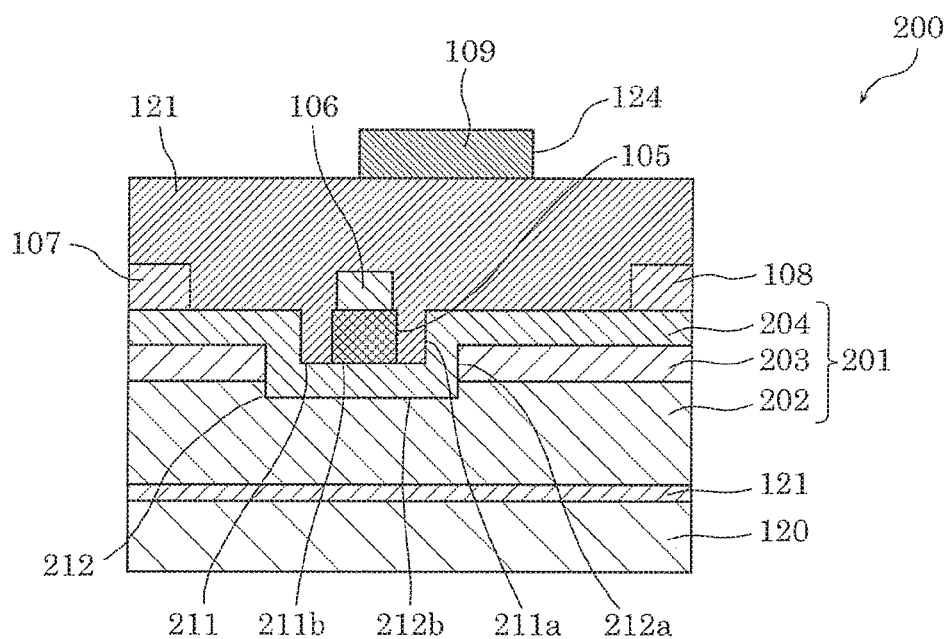
FIG. 4 is cross sectional view of the nitride semiconductor device according to Embodiment 2.

FIG. 3 is a plan view of the nitride semiconductor device according to this embodiment. FIG. 4 is a cross sectional view of the nitride semiconductor device according to this embodiment. The cross section illustrated in FIG. 4 is taken at line II-II in FIG. 3.

As illustrated in FIG. 3, in a plan view, the nitride semiconductor device according to this embodiment is configured of nitride semiconductor devices 200 configured as illustrated in FIG. 4 arranged adjacent to one another.

As illustrated in FIG. 4, in nitride semiconductor device 200 according to this embodiment, nitride semiconductor layered structure 201 includes first nitride semiconductor layer 202, second nitride semiconductor layer 203, and third nitride semiconductor layer 204.

Second nitride semiconductor layer 203 is partially disposed on first nitride semiconductor layer 202. Third nitride semiconductor layer 204 is disposed so as to cover first nitride semiconductor layer 202 and second nitride semiconductor layer 203. Accordingly, the bottom surface and side surface of recess 211 included in nitride semiconductor layered structure 201 are a surface of third nitride semiconductor layer 204.

The band gap of second nitride semiconductor layer 203 is greater than the band gap of first nitride semiconductor layer 202. The band gap of third nitride semiconductor layer 204 is greater than the band gap of first nitride semiconductor layer 202. Note that the band gaps of second nitride semiconductor layer 203 and third nitride semiconductor layer 204 may be the same.

Second nitride semiconductor layer 203 is preferably greater than the band gap of third nitride semiconductor layer 204. With this configuration, there is an energy difference at the interface between second nitride semiconductor layer 203 and third nitride semiconductor layer 204, which makes it difficult for the carriers of the two-dimensional electron gas to be captured by the surface traps on third nitride semiconductor layer 204. This makes it possible to reduce current collapse.

First nitride semiconductor layer 202 is, for example, an undoped GaN layer having a film thickness of approximately 3μm. Second nitride semiconductor layer 203 is, for example, an undoped $Al_{0.3}Ga_{0.8}N$ layer having a film thickness of approximately 80 nm. Third nitride semiconductor layer 204 is, for example, an undoped $Al_{0.2}Ga_{0.8}N$ layer having a film thickness of approximately 20 nm.

P-type nitride semiconductor layer 105 is, for example, a p-type $Al_{0.1}Ga_{0.9}N$ layer having a film thickness of approximately 100 nm. P-type nitride semiconductor layer 105 preferably has a hole concentration that yields a normally-off device whose 2DEG layer carrier density is sufficiently low in the lower region of p-type nitride semiconductor layer 105. For example, the concentration of the p-type dopant, which is Mg, is approximately at least $2 \times 10^{19}/cm^3$ and at most $5 \times 10^{19}/cm^3$.

Nitride semiconductor layered structure 201 includes recess 211 (first recess) defined by recess side surface 211a and recess bottom surface 211b, and recess 212 (second recess) defined by recess side surface 212a and recess bottom surface 212b. Recess 212 penetrates through second nitride semiconductor layer 203. P-type nitride semiconductor layer 105 is disposed in recess 211 and is separated from recess side surface 211a. In other words, p-type nitride semiconductor layer 105 is not in contact with recess side surface 211a.

With this configuration, the electric field into the 2DEG layer concentrates in the bottom portion of recess side surface 211a and the bottom portion of recess side surface 212a. Compared to when only recess 211 is formed, like in nitride semiconductor device 100 according to Embodiment 1, the electric field peak strength decreases. Accordingly, the energy of carriers accelerated by the electric field decreases, making it possible to reduce the probability that the carriers will be trapped by defects. This makes it possible to inhibit current collapse.

Moreover, with this embodiment, when recess 212 is formed by etching, there is no need to use a well-controlled etch stop technique in second nitride semiconductor layer 203, making it possible to improve manufacturing yield rate.

Note that, as illustrated in FIG. 4, recess side surface 211a and recess bottom surface 211b are a surface of third nitride semiconductor layer 204. Recess side surface 212a includes a surface of second nitride semiconductor layer 203. Recess bottom surface 212b includes a surface of first nitride semiconductor layer 202.

In this case, a 2DEG layer functioning as the channel region is formed in first nitride semiconductor layer 202, in the vicinity of the interface between first nitride semiconductor layer 202 and second nitride semiconductor layer 203. Moreover, when a threshold voltage or higher voltage is applied to gate electrode 106, such as a voltage of approximately 4 volts, a 2DEG layer functioning as the channel region is formed in first nitride semiconductor layer 202, in the vicinity of the interface between first nitride semiconductor layer 202 and third nitride semiconductor layer 204.

Source electrode 107 is disposed to one side of recess 211 included in nitride semiconductor layered structure 201 and drain electrode 108 is disposed to the other side of recess 211. Second nitride semiconductor layer 203 and third nitride semiconductor layer 204 are stacked on drain electrode 108 side relative to recess 211. Accordingly, as disclosed in Japanese Unexamined Patent Application Publication No. 2008-211172,the distance between the surface of nitride semiconductor layered structure 201 and the 2DEG is greater compared to when the barrier layer is a single layer, which makes it possible to inhibit current collapse stemming from surface defects.

When the drain voltage is increased in a state in which the gate is off, the depletion layer extends to the drain electrode 108 side relative to recess 211. Since the depletion layer end at which the electric field resulting from the drain voltage concentrates moves to the region in which second nitride semiconductor layer 203 and third nitride semiconductor layer 204 are stacked, compared to when a single layer structure is used, the probability that electrons accelerated by a high electric field will be trapped by surface defects reduces, which makes it possible to inhibit current collapse.

Insulating film 121 including, for example, SiN, is disposed above nitride semiconductor layered structure 201. Field plate electrode 109 electrically connected to source electrode 107 is disposed on insulating film 121. Note that in FIG. 3, in order to facilitate clear understanding of nitride semiconductor device 100, illustration of insulating film 121 is omitted.

As illustrated in FIG. 3, source electrode 107 and field plate electrode 109 are electrically connected via insulating film opening 121a formed above a portion of source electrode 107. In a plan view, field plate electrode 109 is disposed between gate electrode 106 and drain electrode 108, and partially overlaps gate electrode 106. Field plate electrode 109 extends from only part of insulating film opening 121a in order to prevent an unwanted increase in parasitic capacitance between gate electrode 106 and source electrode 107. Note that the source electrode pad (not illustrated in the drawings) is connected to source electrode 107 via the remaining portion of insulating film opening 121a.

An electric field collects at end 124 of the drain electrode 108 side of field plate electrode 109 when voltage is applied to the drain. With nitride semiconductor device 200 according to this embodiment, as illustrated in FIG. 3, end 124 on the drain electrode 108 side of field plate electrode 109 is, in a plan view, disposed between recess 211 and drain electrode 108.

This makes it possible to avoid electric field concentration below recess 211 at third nitride semiconductor layer 204, which causes the distance between the 2DEG layer and nitride semiconductor layered structure 201 to be close. In other words, as a result of causing the electric field to concentrate in portions where the distance between the surface of nitride semiconductor layered structure 201 and the 2DEG layer is long, that is to say, in regions where second nitride semiconductor layer 203 and third nitride semiconductor layer 204 are stacked, current collapse can be inhibited.

Moreover, in nitride semiconductor device 200 according to this embodiment, the composition and film thickness of second nitride semiconductor layer 203, which do not affect gate threshold voltage, may be set freely so long as it is at or less than the critical thickness at which crystalline considerably deteriorates. In order to increase sheet carrier density and achieve a low-resistance state, second nitride semiconductor layer 203 has a film thickness of 20 nm and is made of $Al_{0.3}Ga_{0.7}N$ having an Al composition of 30%.

Third nitride semiconductor layer 204 formed on recess 211 has a limited composition and thickness due to the influence on the gate threshold voltage. In nitride semiconductor device 200 according to this embodiment, third nitride semiconductor layer 204 is made of $Al_{0.2}Ga_{0.8}N$ having an Al composition of 20%, which can be formed thicker than AlGaN having an Al composition of 30%. In other words, the band gap of third nitride semiconductor layer 204 is preferably less than the band gap of second nitride semiconductor layer 203.

With the above embodiment, current collapse can be inhibited and a low-resistance state can be achieved.

Variation 1 of Embodiment 2

The nitride semiconductor device according to Variation 1 of Embodiment 2 will be described with reference to FIG. 5. Hereinafter, the description will focus on the points of difference from Embodiment 2.

Figure 5:
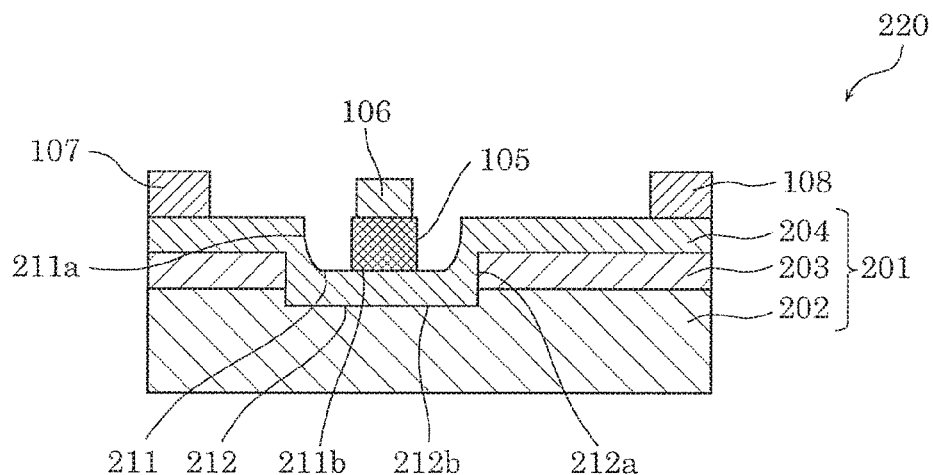
FIG. 5 is cross sectional view of the nitride semiconductor device according to Variation 1 of Embodiment 2.

FIG. 5 is cross sectional view of nitride semiconductor device 220 according to Variation 1 of Embodiment 2, in particular in the region that differs from Embodiment 2.

Nitride semiconductor device 220 according to this variation differs from nitride semiconductor device 200 according to Embodiment 2 in regard to the formation of recess 211.

As illustrated in FIG. 5, recess side surface 211a of nitride semiconductor device 220 is rounded from the top surface of third nitride semiconductor layer 204 to recess bottom surface 211b.

With this configuration, compared to when recess side surface 211a is approximately perpendicular to recess bottom surface 211b, electric field concentration into the 2DEG layer in the lower portion of recess 211 can be alleviated. This makes it possible to inhibit current collapse in nitride semiconductor device 220.

Variation 2 of Embodiment 2

The nitride semiconductor device according to Variation 2 of Embodiment 2 will be described with reference to FIG. 6. Hereinafter, the description will focus on the points of difference from Embodiment 2.

Figure 6:
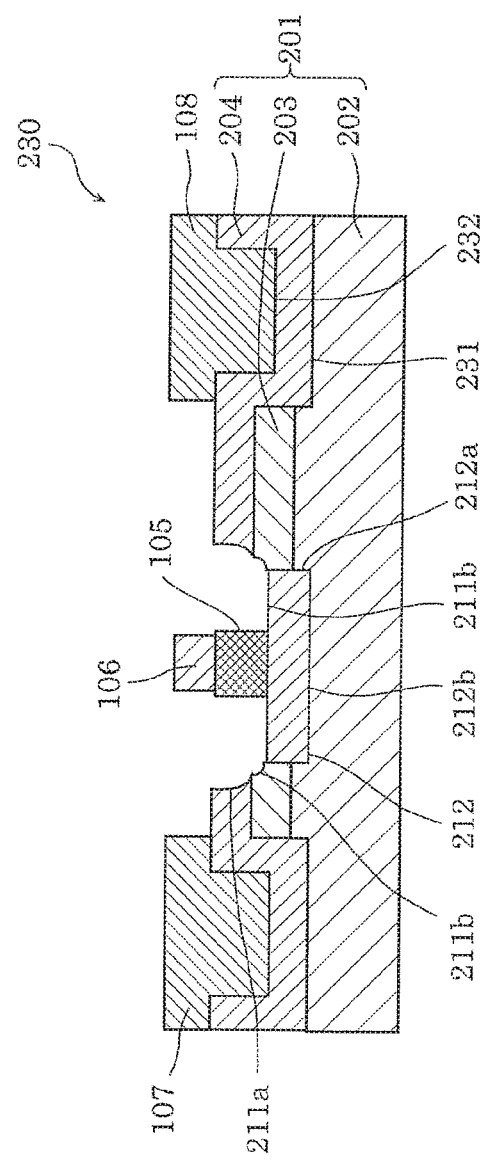
FIG. 6 is cross sectional view of the nitride semiconductor device according to Variation 2 of Embodiment 2.

FIG. 6 is cross sectional view of nitride semiconductor device 230 according to Variation 2 of Embodiment 2, in particular in the region that differs from Embodiment 2.

Nitride semiconductor device 230 according to this variation differs from nitride semiconductor device 200 according to Embodiment 2 in regard to the formation of recess 211.

As illustrated in FIG. 6, recess side surface 211a and recess side surface 211b of nitride semiconductor device 230 are rounded. Recess side surface 211a is rounded from the top surface of third nitride semiconductor layer 204 to the surface of second nitride semiconductor layer 203, and recess side surface 211b is rounded from the surface of second nitride semiconductor layer 203 to recess bottom surface 211b.

Such a shape can be obtained by isotropic dry etching using a halogen gas such as chlorine gas after the forming of third nitride semiconductor layer 204 and before the forming of p-type nitride semiconductor layer 105. Note that such a shape may be obtained by wet etching using an acid or alkaline. When second nitride semiconductor layer 203 and third nitride semiconductor layer 204 have different compositions, the etching rates are also different, so each layer has a different cross sectional shape.

With this configuration, compared to when recess side surface 211a is approximately perpendicular to recess bottom surface 211b, electric field concentration into the 2DEG layer in the lower portion of recess 211 can be alleviated. This makes it possible to inhibit current collapse in nitride semiconductor device 230. Moreover, since electric field concentration also occurs at the boundary between recess side surface 212a of the second nitride semiconductor layer and recess side surface 211a of the third nitride semiconductor layer, the peak electric field intensity can be reduced by dispersing the areas in which the electric field concentrates, which makes it possible to inhibit current collapse.

Note that in this variation, as illustrated in FIG. 6, on both sides of the gate region, recesses 231 are formed penetrating through second nitride semiconductor layer 203 and reaching first nitride semiconductor layered structure 201. For example, as illustrated in FIG. 6, third nitride semiconductor layer 204 is formed so as to cover recesses 231, and as a result, nitride semiconductor device 230 includes recesses 232 (fourth recesses) in third nitride semiconductor layer 204.

Here, source electrode 107 and drain electrode 108 are disposed on third nitride semiconductor layer 204 so as to cover recesses 232. With this configuration, compared to when recesses 231 are not formed, the distance between the 2DEG layer and source electrode 107 and the distance between the 2DEG layer and drain electrode 108 can be reduced, making it possible to reduce contact resistance.

Moreover, when there is a difference in conduction band energy level between second nitride semiconductor layer 203 and third nitride semiconductor layer 204, the amount of difference determines the degree of electron movement hindrance, and makes it easier for contact resistance to worsen. Accordingly, below one or both of source electrode 107 and drain electrode 108, second nitride semiconductor layer 203 may be thinned or removed to reduce contact resistance.

Here, although not illustrated in the drawings, below source electrode 107 and drain electrode 108, second nitride semiconductor layer 203 and third nitride semiconductor layer 204 are completely removed by dry etching, and direct contact with the 2DEG layer from the etched side surfaces is also effective in reducing contact resistance.

Embodiment 3

Hereinafter, Embodiment 3 will be described with focus on the points of difference from Embodiment 2.

Nitride semiconductor device 300 according to this embodiment differs from nitride semiconductor device 100 according to Embodiment 1 in that p-type nitride semiconductor layer 310 is formed on part of the top surface of the third nitride semiconductor layer.

Figure 7:
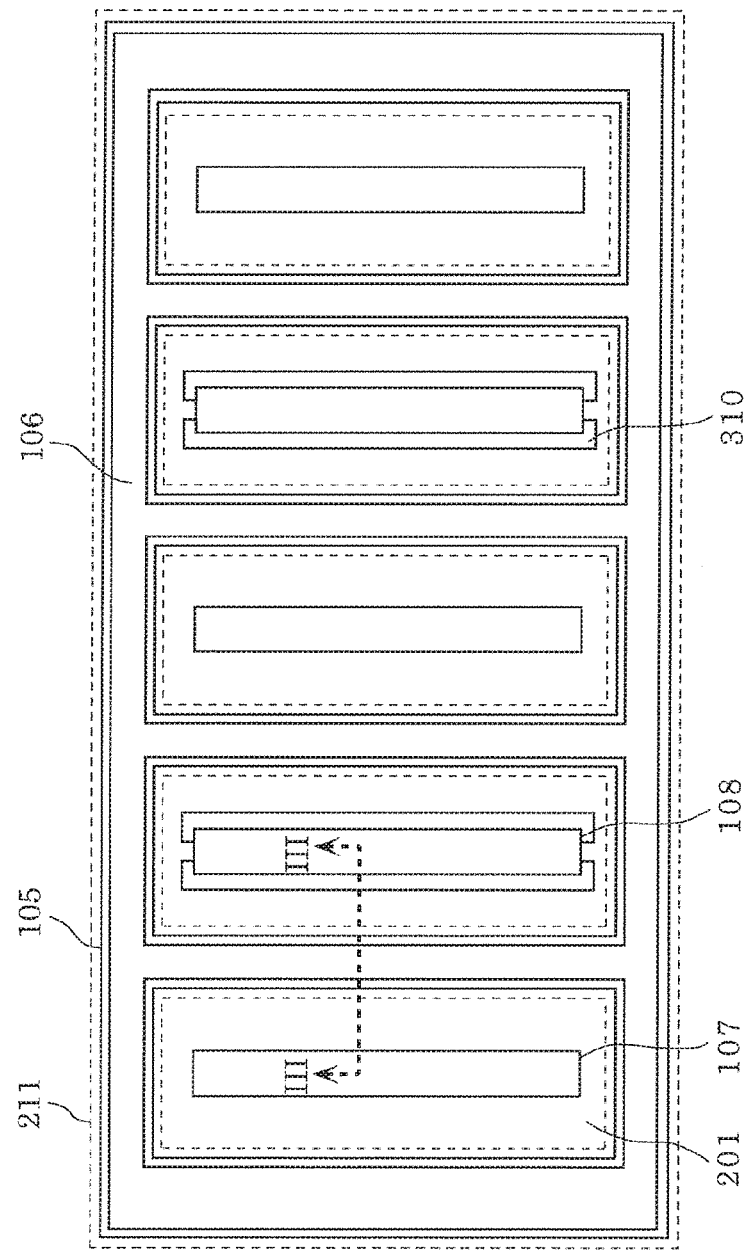
FIG. 7 is a plan view of the nitride semiconductor device according to Embodiment 3.
Figure 8:
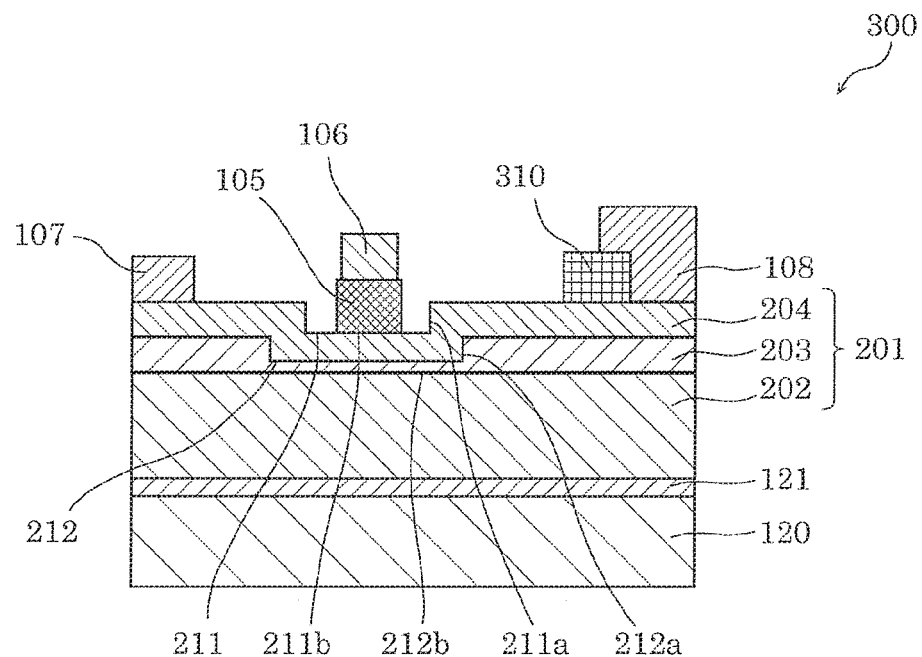
FIG. 8 is cross sectional view of the nitride semiconductor device according to Embodiment 3.

FIG. 7 is a plan view of the nitride semiconductor device according to Embodiment 3. FIG. 8 is cross sectional view of the nitride semiconductor device according to Embodiment 3. The cross section illustrated in FIG. 8 is taken at line III-III in FIG. 7.

As illustrated in FIG. 7, in a plan view, the nitride semiconductor device according to this embodiment is configured of nitride semiconductor devices 300 configured as illustrated in FIG. 8 arranged adjacent to one another.

As illustrated in FIG. 8, in nitride semiconductor device 300, second nitride semiconductor layer 203 is disposed on first nitride semiconductor layer 202. Recess 212 (second recess) is formed in second nitride semiconductor layer 203 so as to have a depth of approximately 70 nm. Recess 212 does not reach first nitride semiconductor layer 202. Accordingly, side surface (recess side surface) 212a and bottom surface (recess bottom surface) 212b of recess 212 are a surface of second nitride semiconductor layer 203.

With this configuration, directly below recess 212, there is an energy difference at the interface between second nitride semiconductor layer 203 and third nitride semiconductor layer 204, which, compared to Embodiment 2, makes it even more difficult for the carriers of the two-dimensional electron gas to be captured by the surface traps on third nitride semiconductor layer 204. This makes it possible to further reduce current collapse.

Moreover, since recess 212 does not penetrate through second nitride semiconductor layer 203, the two-dimensional electron gas layer is formed parallel to the major surface of substrate 120 in entirety. Accordingly, since the distance that the carriers move can be made to be shorter than in Embodiment 2, a low-resistance state can be achieved.

Further, third nitride semiconductor layer 204 is formed on second nitride semiconductor layer 203 so as to cover recess 212. Accordingly, recess 211 (first recess) is formed in third nitride semiconductor layer 204.

In this embodiment, the film thicknesses of second nitride semiconductor layer 203 and third nitride semiconductor layer 204 directly below recess 211 are 10 nm each, and the Mg concentration of p-type nitride semiconductor layer 105 is approximately $5 \times 10^{19}/cm^3$. With this configuration, in a state in which a threshold voltage or higher voltage is not applied to gate electrode 106, there is no 2DEG layer below gate electrode 106. Accordingly, the gate capacitance can be reduced.

In this embodiment, nitride semiconductor device 300 includes a hole injection part formed more adjacent to drain electrode 208 than gate electrode 106. The hole injection part is configured of p-type nitride semiconductor layer 310 (second p-type nitride semiconductor layer) and drain electrode 108 (hole injection electrode) disposed above p-type nitride semiconductor layer 310.

With this configuration, when voltage is applied to the drain and carriers become trapped, resulting in a negative charge, holes are injected from the hole injection part, cancelling out the negative charge. Accordingly, since the negative charge that constricts the electrons of the 2DEG layer is cancelled out, it is possible to inhibit current collapse.

Note that with nitride semiconductor device 300 according to this embodiment, the hole injection part and drain electrode 108 are formed abutting one another and the hole injection part and drain electrode 108 are formed as the same electrode so as to reduce the size of the device, but the hole injection part and drain electrode 108 may be disposed separated from each other and the hole injection part and drain electrode 108 may be line connected with a different electrode.

Variation of Embodiment 3

The nitride semiconductor device according to a variation of Embodiment 3 will be described with reference to FIG. 9. Hereinafter, the description will focus on the points of difference from Embodiment 2.

Nitride semiconductor device 320 according to this variation differs from nitride semiconductor device 200 according to Embodiment 2 in regard to the formation of recess 211.

Figure 9:
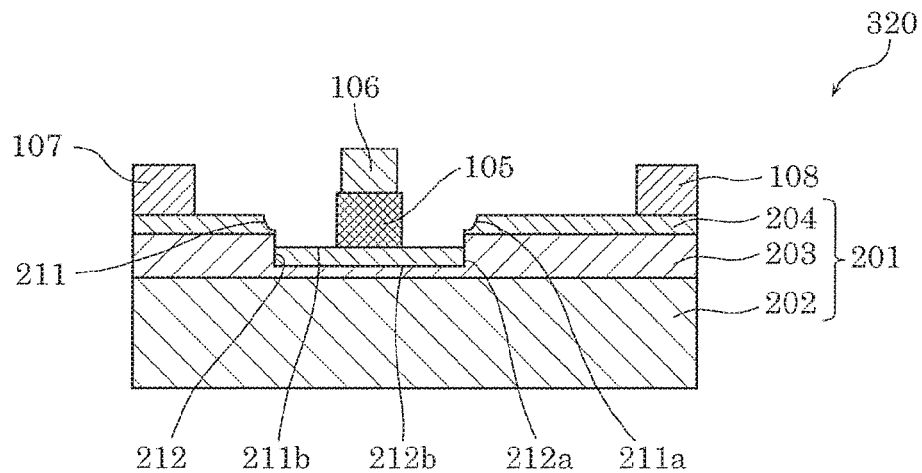
FIG. 9 is cross sectional view of a nitride semiconductor device according to a variation of Embodiment 3.

FIG. 9 is cross sectional view of the nitride semiconductor device according to a variation of Embodiment 3, in particular in the region that differs from Embodiment 3.

As illustrated in FIG. 9, recess side surface 211a of nitride semiconductor device 320 is rounded from the top surface of third nitride semiconductor layer 204 to second nitride semiconductor layer 203. Moreover, recess side surface 212a of recess 212 formed in second nitride semiconductor layer 203 is approximately perpendicular to recess bottom surface 212b of recess 212

As illustrated in FIG. 9, such a shape in nitride semiconductor device 320 can be obtained by isotropic dry etching using a halogen gas such as chlorine gas after third nitride semiconductor layer 204 is stacked and before p-type nitride semiconductor layer 105 is formed. Note that such a shape may be obtained by wet etching using an acid or alkaline. When second nitride semiconductor layer 203 and third nitride semiconductor layer 204 have different compositions, the etching rates are also different, so each layer has a different cross sectional shape.

With this configuration, compared to when recess side surface 211a is approximately perpendicular to recess bottom surface 211b, electric field concentration into the 2DEG layer in the lower portion of recess 211 can be alleviated. This makes it possible to inhibit current collapse in nitride semiconductor device 320. Moreover, since electric field concentration also occurs at the boundary between recess side surface 211a of the second nitride semiconductor layer and recess side surface 211a of the third nitride semiconductor layer, the peak electric field intensity can be reduced by dispersing the areas in which the electric field concentrates, which makes it possible to inhibit current collapse.

Embodiment 4

Hereinafter, Embodiment 4 will be described with focus on the points of difference from Embodiment 2.

Nitride semiconductor device 400 according to this embodiment differs from nitride semiconductor device 100 according to Embodiment 1 in that third nitride semiconductor layer 204 is partially formed on second nitride semiconductor layer 203.

Figure 10:
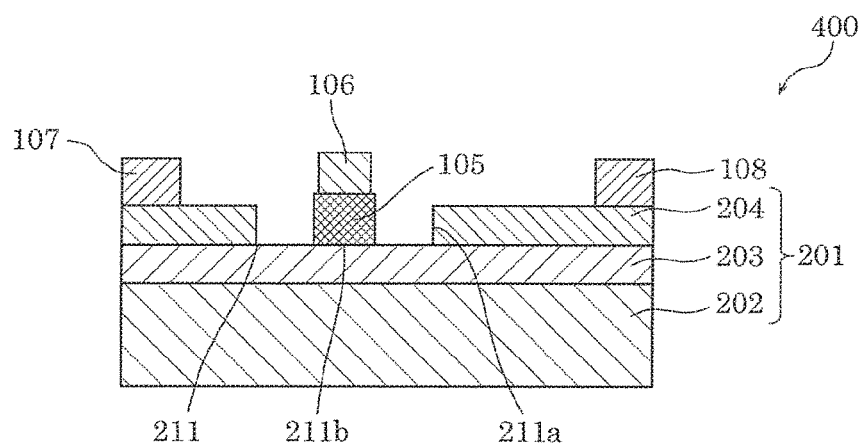
FIG. 10 is cross sectional view of the nitride semiconductor device according to Embodiment 4.

FIG. 10 is cross sectional view of the nitride semiconductor device according to Embodiment 4.

As illustrated in FIG. 10, in nitride semiconductor device 400, second nitride semiconductor layer 203 is disposed on first nitride semiconductor layer 202. Third nitride semiconductor layer 204 is partially disposed on second nitride semiconductor layer 203.

In other words, recess 211 is formed in nitride semiconductor layered structure 201, where third nitride semiconductor layer 204 defines the side surface (recess side surface 211a) and second nitride semiconductor layer 203 defines the bottom surface (recess bottom surface 211b). Recess side surface 211a is a surface of third nitride semiconductor layer 204 and recess bottom surface 211b is a surface of second nitride semiconductor layer 203.

Moreover, p-type nitride semiconductor layer 105 is formed in recess 211, in a location such that p-type nitride semiconductor layer 105 does not contact recess side surface 211a. Furthermore, gate electrode 106 is formed on p-type nitride semiconductor layer 105.

Moreover, source electrode 107 is formed on third nitride semiconductor layer 204, to one side of recess 211, and drain electrode 108 is formed on third nitride semiconductor layer 204, to the other side of recess 211.

First nitride semiconductor layer 202 is, for example, an undoped GaN layer having a film thickness of approximately 3 μm. Second nitride semiconductor layer 203 is, for example, an undoped $Al_{0.2}Ga_{0.8}N$ layer having a film thickness of approximately 20 nm. Third nitride semiconductor layer 204 is, for example, an undoped $Al_{0.2}Ga_{0.8}N$ layer having a film thickness of approximately 50 nm.

Since the film thickness of second nitride semiconductor layer 203 below recess 211 is approximately 20 nm, and the Mg concentration of p-type nitride semiconductor layer 105 is $5\times10^{19}/cm^3$, in a state in which a threshold voltage or higher voltage is not being applied to gate electrode 106, there is no 2DEG layer below gate electrode 106. Accordingly, the gate capacitance can be reduced.

Since second nitride semiconductor layer 203 and third nitride semiconductor layer 204 are stacked between recess 211 and drain electrode 108, compared to when the nitride semiconductor layer is a single layer, the distance between the surface of nitride semiconductor layered structure 201 and the 2DEG layer increases, making it possible to inhibit current collapse that stems from surface defects.

Moreover, when the drain voltage (voltage applied to drain electrode 108) is increased in a state in which the gate is off (voltage is not being applied to gate electrode 106), the depletion layer extends to drain electrode 108 side relative to recess side surface 211a. Since depletion layer end at which the electric field resulting from the drain voltage concentrates moves to the region in which second nitride semiconductor layer 203 and third nitride semiconductor layer 204 are stacked, compared to when a single layer structure is used for the nitride semiconductor layer, the probability that electrons accelerated by a high electric field will be trapped by surface defects reduces. This makes it possible to inhibit current collapse in nitride semiconductor device 400.

Embodiment 5

Hereinafter, Embodiment 5 will be described with focus on the points of difference from Embodiment 2.

Nitride semiconductor device 500 according to this embodiment differs from nitride semiconductor device 200 according to Embodiment 2 in that nitride semiconductor device 500 includes a plurality of recesses and gate electrodes formed in the recesses.

Figure 11:
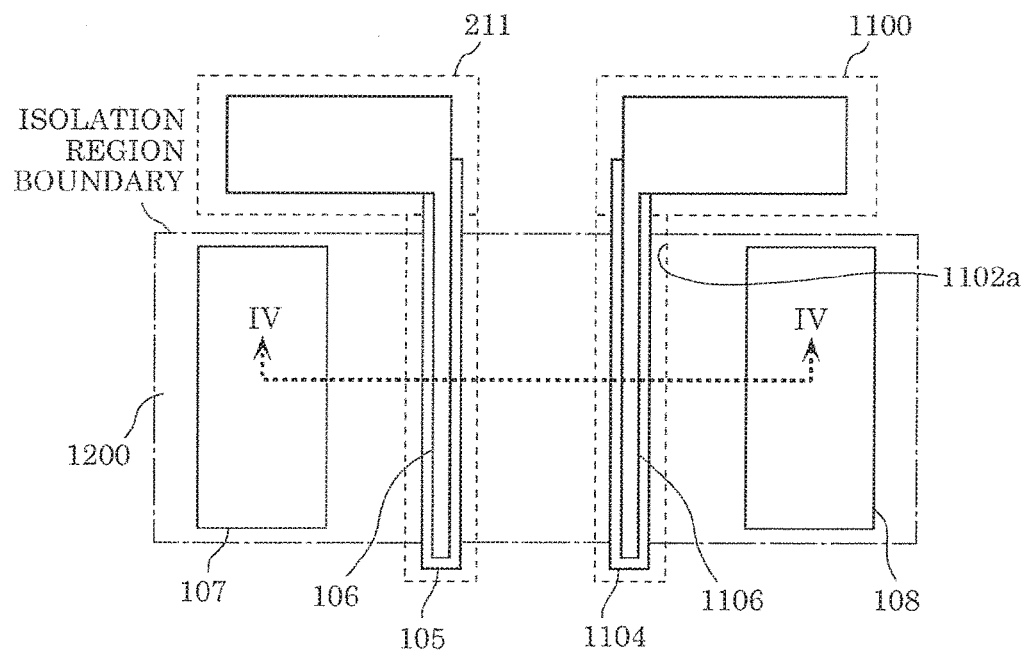
FIG. 11 is a plan view of the nitride semiconductor device according to Embodiment 5.
Figure 12:
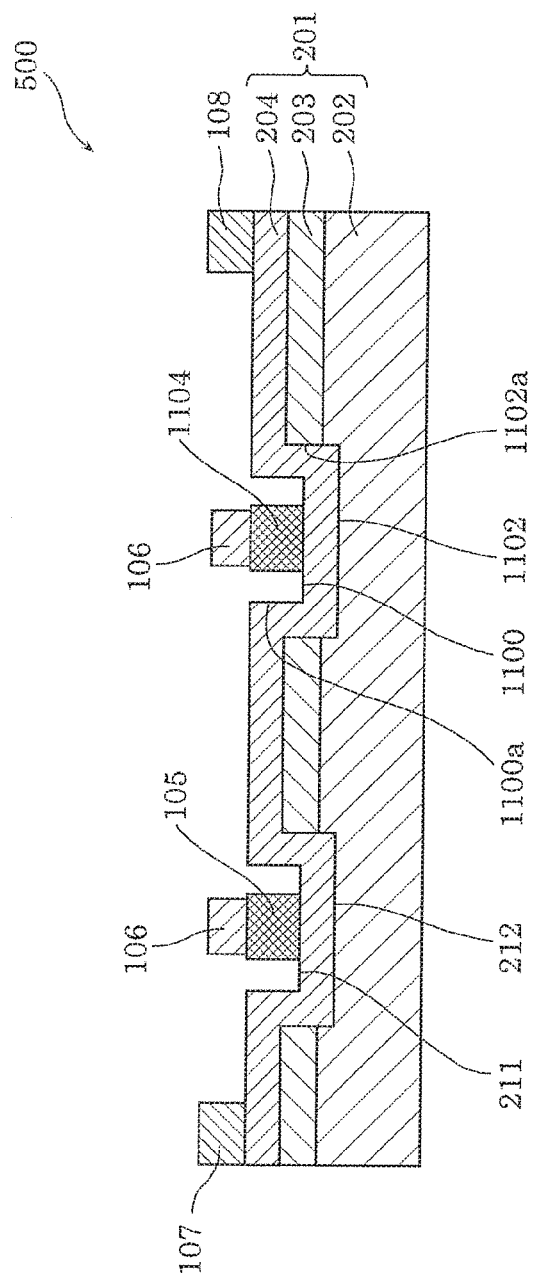
FIG. 12 is cross sectional view of the nitride semiconductor device according to Embodiment 5.

FIG. 11 is a plan view of the nitride semiconductor device according to Embodiment 5. FIG. 12 is cross sectional view of the nitride semiconductor device according to Embodiment 5. The cross section illustrated in FIG. 12 is taken at line IV-IV in FIG. 11.

As illustrated in FIG. 11 and FIG. 12, in nitride semiconductor device 500, second nitride semiconductor layer 203 is partially formed on first nitride semiconductor layer 202. In other words, recess 212 and recess 1102 are formed in sections of second nitride semiconductor layer 203. Furthermore, third nitride semiconductor layer 204 is formed above second nitride semiconductor layer 203, recess 212, and recess 1102. With this, recesses 211 and 1100 are formed above recesses 212 and 1102, respectively.

P-type nitride semiconductor layer 105 is formed in recess 211, in a location such that p-type nitride semiconductor layer 105 does not contact the recess side surface. Furthermore, gate electrode (first gate electrode) 106 is formed on p-type nitride semiconductor layer 105. Similarly, p-type nitride semiconductor layer 1104 (second p-type nitride semiconductor layer) is formed in recess 1100, in a location such that p-type nitride semiconductor layer 1104 does not contact recess side surface 1100a. Furthermore, gate electrode 1106 is formed on p-type nitride semiconductor layer 1104.

Note that similar to nitride semiconductor device 100 described in Embodiment 1, an insulating film is formed on third nitride semiconductor layer 204 so as to cover first electrode 107, second electrode 108, first gate electrode 106, and second gate electrode 1106, but illustration of the insulating film is omitted from FIG. 12.

Nitride semiconductor device 500 functions as a two-way switch. The two-way switch interrupts current from flowing between first electrode 107 and second electrode 108 when a voltage less than or equal to first gate electrode 106 threshold voltage is applied between first electrode 107 and first gate electrode 106 and a voltage less than or equal to second gate electrode 1106 threshold voltage is applied between second electrode 108 and second gate electrode 1106.

Accordingly, even when the potential of second electrode 108 is lower than the potential of first electrode 107, a 2DEG layer can be pinched off below second gate electrode 1106. Accordingly, current can be interrupted from flowing in either direction between first electrode 107 and second electrode 108.

In nitride semiconductor device 500, nitride semiconductor layered structure 201 includes, in addition to recess 211 and recess 212 described above, recess 1100 (third recess) and recess 1102. P-type nitride semiconductor layer 1104 is disposed in recess 1100 and is separated from recess side surface 1100a.

In other words, p-type nitride semiconductor layer 1104 is not in contact with recess side surface 1100a. Second gate electrode 1106 is disposed above p-type nitride semiconductor layer 1104.

P-type nitride semiconductor layer 1104 is, for example, a p-type GaN layer having a film thickness of approximately 200 nm. P-type nitride semiconductor layer 1104 preferably has a hole concentration that yields a normally-off device whose 2DEG layer carrier density is sufficiently low in the lower region of p-type nitride semiconductor layer 1104. For example, the concentration of the p-type dopant, which is Mg, is approximately at least $2/cm^3$ and at most $5\times10^{19}/cm^3$. With this configuration, in a state in which a voltage greater than or equal to the threshold voltage is not being applied to the gate, no 2DEG layer exists below gate electrode 1106, making it possible to reduce the gate capacitance.

Since second nitride semiconductor layer 203 and third nitride semiconductor layer 204 are stacked on second electrode 108 side relative to recess side surface 1102a, compared to when the nitride semiconductor layer is a single layer, the distance between the surface of nitride semiconductor layered structure 201 and the 2DEG layer increases, making it possible to inhibit current collapse that stems from surface defects.

Moreover, when the voltage of second electrode 108 is increased in a state in which first gate electrode 106 is off, the depletion layer extends to second electrode 108 side relative to recess side surface 1102a. The depletion layer end at which the electric field concentrates moves to a region in which second nitride semiconductor layer 203 and third nitride semiconductor layer 204 are stacked. Accordingly, in nitride semiconductor device 500, compared to when the nitride semiconductor layer is a single layer, electrons accelerated by a high electric field are less likely to be trapped by surface defects. This makes it possible to inhibit current collapse in nitride semiconductor device 500.

Moreover, in nitride semiconductor device 500 according to this embodiment, from the perspective of first gate electrode 106, p-type nitride semiconductor layer 1104 and second gate electrode 1106 achieve the same advantageous effects as the hole injection part described in Embodiment 3. Similarly, from the perspective of second gate electrode 1106, p-type nitride semiconductor layer 105 and first gate electrode 106 are equivalent to the hole injection part.

For example, in a state in which first gate electrode 106 is off and second gate electrode 1106 is on, when carriers become trapped resulting in a negative charge, holes are injected from p-type nitride semiconductor layer 1104, thereby cancelling out the negative charge. Accordingly, since the negative charge that constricts the electrons of the 2DEG layer is cancelled out, it is possible to inhibit current collapse.

Note that, as illustrated in FIG. 11, in a plan view, in nitride semiconductor device 500, the region inward of the isolation region boundary is formed as active region 1200. In active region 1200, first nitride semiconductor layer 202 functions as a semiconductor. However, in the isolation region other than active region 1200, an approximately 100 nm section of first nitride semiconductor layer 202 may be dug out, and, for example, the regions may be deactivated by injecting Fe ions from the surface of first nitride semiconductor layer 202.

Embodiment 6

Next, the nitride semiconductor device according to Embodiment 6 will be described with focus on the differences from Embodiment 1. The main differences between nitride semiconductor device 100 according to Embodiment 1 and nitride semiconductor device 600 according to this embodiment are in the positions in which p-type nitride semiconductor layer 105 and gate electrode 106 are disposed.

Figure 13:
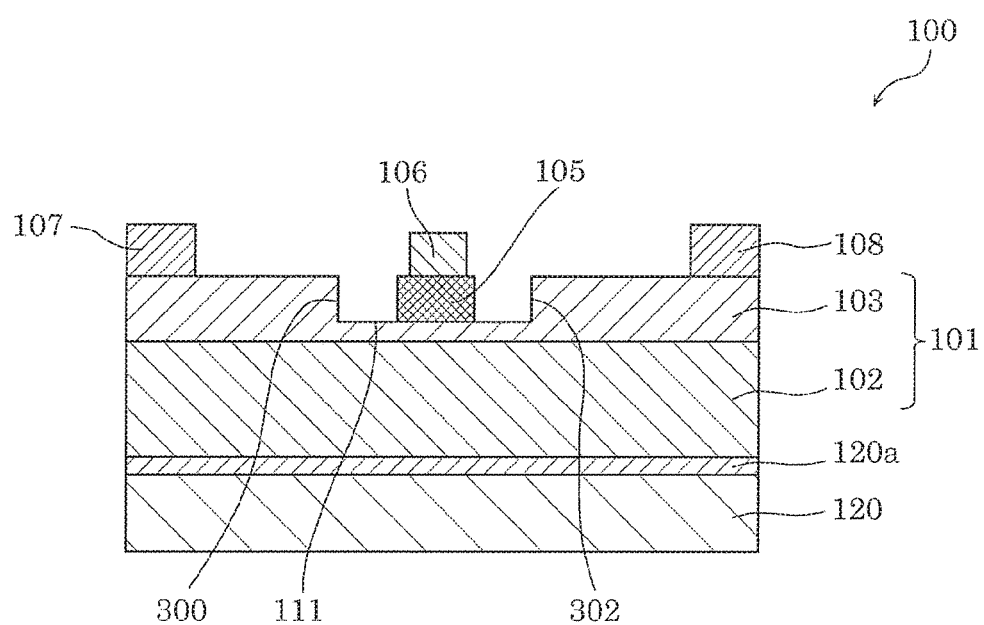
FIG. 13 is cross sectional view of the nitride semiconductor device according to Embodiment 1.
Figure 14:
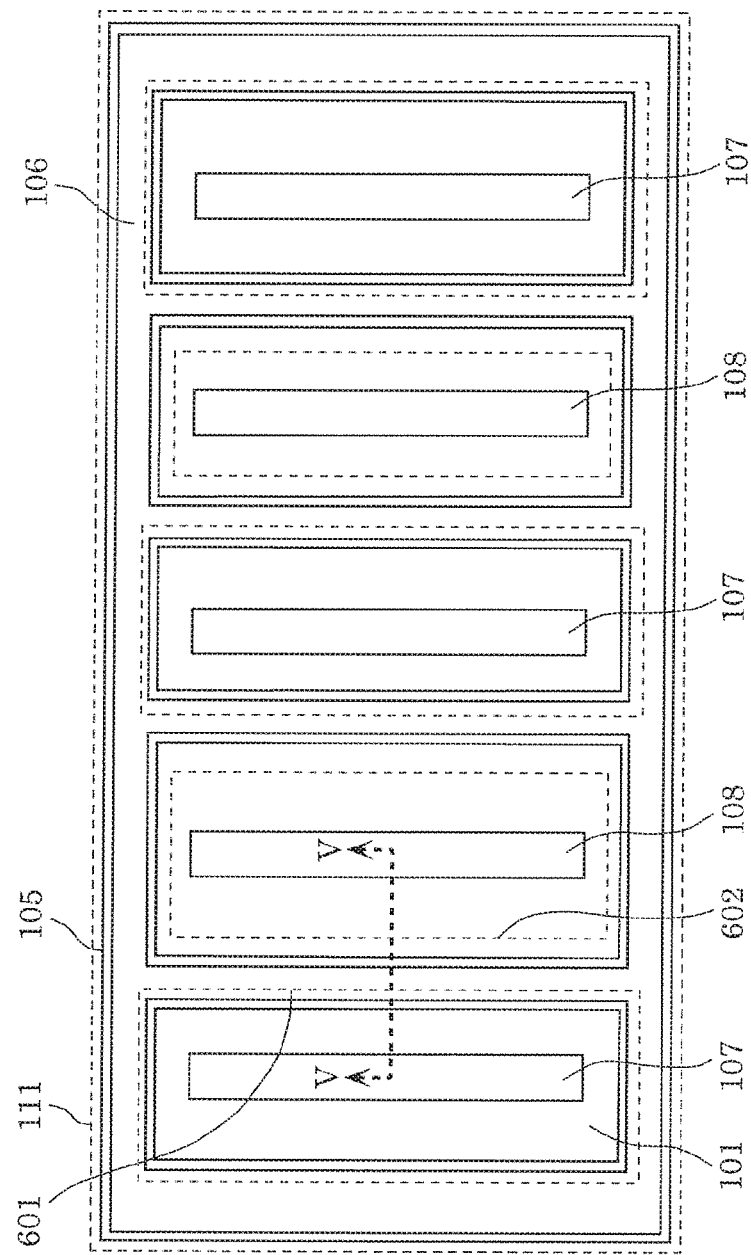
FIG. 14 is a plan view of the nitride semiconductor device according to Embodiment 6.
Figure 15:
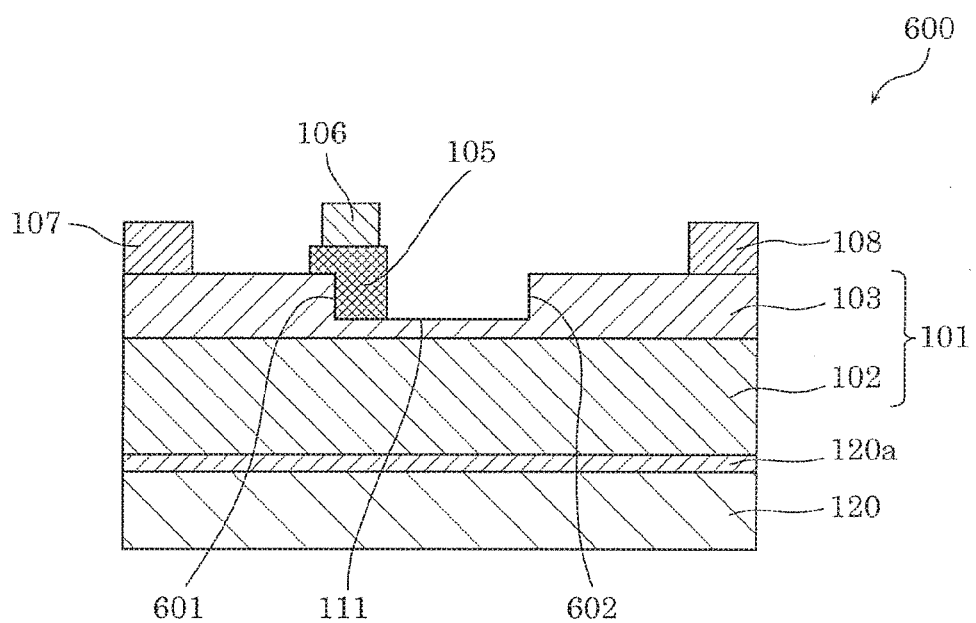
FIG. 15 is cross sectional view of the nitride semiconductor device according to Embodiment 6.

FIG. 13 is cross sectional view of nitride semiconductor device 100 according to Embodiment 1. FIG. 14 is a plan view of nitride semiconductor device 600 according to this embodiment. FIG. 15 illustrates a cross section taken at line V-V in FIG. 14. In FIG. 13, illustration of insulating film 121 and field plate electrode 109 is omitted in nitride semiconductor device 100 according to Embodiment 1 illustrated in FIG. 2.

In all of the above embodiments and variations, including in Embodiment 1, in a plan view of the nitride semiconductor device, p-type nitride semiconductor layer 105 is disposed inside recess 111 in entirety, as illustrated in FIG. 1. In other words, as illustrated in FIG. 13, among recess side surfaces 111a of recess 111, p-type nitride semiconductor layer 105 is separated from first side surface 601 and second side surface 602. First side surface 601 is the side surface closer to first electrode 107 than second electrode 108 among recess side surfaces 111a illustrated in FIG. 2. Second side surface 602 is the side surface closer to second electrode 108 than first electrode 107 among recess side surfaces 111a illustrated in FIG. 2.

In contrast, as illustrated in FIG. 14 and FIG. 15, in nitride semiconductor device 600 according to this embodiment, p-type nitride semiconductor layer 105 covers first side surface 601 and is separated from second side surface 602. P-type nitride semiconductor layer 105 may cover the surface of nitride semiconductor layered structure 101 when recess 111 is not formed. P-type nitride semiconductor layer 105 may be in contact with first side surface 601.

Similar to nitride semiconductor device 100 according to Embodiment 1, nitride semiconductor device 600 according to this embodiment inhibits current collapse and can reduce the gate capacitance more so than the structure disclosed in Japanese Unexamined Patent Application Publication No. 2008-211172. With nitride semiconductor device 600 according to this embodiment, since p-type nitride semiconductor layer 105 is in contact with first side surface 601, a recess is not formed between p-type nitride semiconductor layer 105 and source electrode 107 (hereinafter referred to as "between the gate and source"). Accordingly, compared to Embodiment 1, since there is no region in which the film thickness of second nitride semiconductor layer 103 is thin between the gate and source, the 2DEG carrier density between the gate and source can be increased. As a result, low resistance can be achieved between the gate and source, making it possible to increase transconductance.

Note that nitride semiconductor device 600 according to this embodiment can be combined with another one of the embodiments or variations described above.

Hereinbefore, a semiconductor memory device according to embodiments of the present disclosure was described, but the present disclosure is not limited to these embodiments.

For example, nitride semiconductor device 220 according to Embodiment 1 described above includes a recess whose recess side surface 211a is approximately vertical, but the shape of recess side surface 211a is not limited to this example. For example, recess side surface 211a may be rounded from the top surface of third nitride semiconductor layer 204 to recess bottom surface 211b.

Moreover, the semiconductor material included in the first nitride semiconductor layer, the second nitride semiconductor layer, and the third nitride semiconductor layer is not limited to the above examples and may be changed as necessary.

Moreover, the shape and number of recesses formed may determined by any method.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present disclosure is applicable as a nitride semiconductor device used in next-generation high-frequency devices or high-power switching devices, and in particular, to normally-off nitride semiconductor devices in which a p-type semiconductor layer covers a gate recess.

What is claimed is:

1. A nitride semiconductor device, comprising:
a substrate;
a nitride semiconductor layered structure disposed on the substrate and having a channel region;
a first electrode and a second electrode both disposed on the nitride semiconductor layered structure;
a first p-type nitride semiconductor layer disposed between the first electrode and the second electrode; and
a first gate electrode disposed on the first p-type nitride semiconductor layer,
wherein the nitride semiconductor layered structure includes a first recess, and
the first p-type nitride semiconductor layer is at least partially disposed inside the first recess, and is separated from a side surface of the first recess.

2. The nitride semiconductor device according to claim 1, wherein
the nitride semiconductor layered structure includes:
a first nitride semiconductor layer; and
a second nitride semiconductor layer disposed on the first nitride semiconductor layer and having a band gap that is greater than a band gap of the first nitride semiconductor layer, and
a bottom surface and the side surface of the first recess are a surface of the second nitride semiconductor layer.

3. The nitride semiconductor device according to claim 1, wherein
the nitride semiconductor layered structure includes:
a first nitride semiconductor layer;
a second nitride semiconductor layer disposed on the first nitride semiconductor layer and having a band gap that is greater than a band gap of the first nitride semiconductor layer; and
a third nitride semiconductor layer partially disposed on the second nitride semiconductor layer and having a band gap that is greater than the band gap of the first nitride semiconductor layer,
a bottom surface of the first recess is a surface of the second nitride semiconductor layer, and
the side surface of the first recess is a surface of the third nitride semiconductor layer.

4. The nitride semiconductor device according to claim 1, wherein
the nitride semiconductor layered structure includes:
a first nitride semiconductor layer;
a second nitride semiconductor layer partially disposed on the first nitride semiconductor layer and having a band gap that is greater than a band gap of the first nitride semiconductor layer; and
a third nitride semiconductor layer disposed on the first nitride semiconductor layer and the second nitride semiconductor layer and having a band gap that is greater than the band gap of the first nitride semiconductor layer, and
a bottom surface and the side surface of the first recess are a surface of the third nitride semiconductor layer.

5. The nitride semiconductor device according to claim 1, wherein
the nitride semiconductor layered structure includes:
a first nitride semiconductor layer;
a second nitride semiconductor layer disposed on the first nitride semiconductor layer and having a band gap that is greater than a band gap of the first nitride semiconductor layer; and
a third nitride semiconductor layer disposed on the first nitride semiconductor layer and the second nitride semiconductor layer and having a band gap that is greater than the band gap of the first nitride semiconductor layer,
the bottom surface of the first recess is a surface of the third nitride semiconductor layer, and
the side surface of the first recess is a surface of the second nitride semiconductor layer and a surface of the third nitride semiconductor layer.

6. The nitride semiconductor device according to claim 1, further comprising:
a second p-type nitride semiconductor layer disposed between the first p-type nitride semiconductor layer and the second electrode; and
a second gate electrode disposed on the second p-type nitride semiconductor layer,
wherein the nitride semiconductor layered structure includes a third recess, and
the second p-type nitride semiconductor layer is disposed inside the third recess and is separated from a side surface of the third recess.

7. The nitride semiconductor device according to claim 1, wherein
the side surface of the first recess is rounded.

8. The nitride semiconductor device according to claim 1, wherein
the first gate electrode is in Schottky contact with the first p-type nitride semiconductor layer, and
a first parasitic capacitance between the first gate electrode and the first p-type nitride semiconductor layer is greater than a second parasitic capacitance between the first p-type nitride semiconductor layer and the channel region.

9. The nitride semiconductor device according to claim 1, wherein
a hole concentration of the first p-type nitride semiconductor layer decreases one of continuously and stepwise from a top surface toward a bottom surface of the first p-type nitride semiconductor layer, the top surface being adjacent the first gate electrode and the bottom surface being adjacent the nitride semiconductor layered structure.

10. The nitride semiconductor device according to claim 1, wherein
in a plan view, the first p-type nitride semiconductor layer is disposed inside the first recess in entirety,
the side surface of the first recess includes a first side surface closer to the first electrode than the second electrode and a second side surface closer to the second electrode than the first electrode, and
the first p-type nitride semiconductor layer is separated from the first side surface and the second side surface.

11. The nitride semiconductor device according to claim 1, wherein
the side surface of the first recess includes a first side surface closer to the first electrode than the second electrode and a second side surface closer to the second electrode than the first electrode, and
the first p-type nitride semiconductor layer covers the first side surface and is separated from the second side surface.

12. The nitride semiconductor device according to claim 2, wherein
the first nitride semiconductor layer includes GaN, and
the second nitride semiconductor layer includes AlGaN.

13. The nitride semiconductor device according to claim 3, wherein
the nitride semiconductor layered structure includes a fourth recess,
the first electrode is at least partially disposed inside the fourth recess, and
a bottom surface and a side surface of the fourth recess are a surface of the third nitride semiconductor layer.

14. The nitride semiconductor device according to claim 3, wherein
the third nitride semiconductor layer includes AlGaN and has a composition ratio different from a compositional ratio of the second nitride semiconductor layer.

15. The nitride semiconductor device according to claim 4, wherein
the nitride semiconductor layered structure includes a second recess penetrating through the second nitride semiconductor layer,
the second recess is disposed below the first recess, and
a bottom surface and a side surface of the second recess are a surface of the second nitride semiconductor layer.

16. The nitride semiconductor device according to claim 4, wherein
the nitride semiconductor layered structure includes a second recess in the second nitride semiconductor layer,
the second recess is disposed below the first recess,
a bottom surface of the second recess is a surface of the first nitride semiconductor layer, and
a side surface of the second recess includes a surface of the second nitride semiconductor layer.

17. The nitride semiconductor device according to claim 14, wherein
the band gap of the second nitride semiconductor layer is greater than the band gap of the third nitride semiconductor layer.

* * * * *